United States Patent
Itagaki et al.

(10) Patent No.: US 8,084,307 B2
(45) Date of Patent: Dec. 27, 2011

(54) METHOD FOR MANUFACTURING THIN FILM TRANSISTOR

(75) Inventors: Naho Itagaki, Yokohama (JP); Tatsuya Iwasaki, Machida (JP); Toru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 77 days.

(21) Appl. No.: 12/447,199

(22) PCT Filed: Nov. 9, 2007

(86) PCT No.: PCT/JP2007/072234
§ 371 (c)(1),
(2), (4) Date: Apr. 24, 2009

(87) PCT Pub. No.: WO2008/062720
PCT Pub. Date: May 29, 2008

(65) Prior Publication Data
US 2009/0269880 A1    Oct. 29, 2009

(30) Foreign Application Priority Data
Nov. 21, 2006 (JP) ................. 2006-314243

(51) Int. Cl.
*H01L 21/84* (2006.01)
*H01L 21/00* (2006.01)
(52) U.S. Cl. ........... 438/149; 257/E21.051; 257/E21.37; 257/E21.4; 257/E21.654; 438/609
(58) Field of Classification Search ........... 257/E21.051, 257/E21.37, E21.4, E21.654; 438/149, 609
See application file for complete search history.

(56) References Cited

U.S. PATENT DOCUMENTS

| | | | |
|---|---|---|---|
| 7,262,463 B2 | 8/2007 | Hoffman | 257/347 |
| 7,473,942 B2 | 1/2009 | Iwasaki et al. | 257/103 |
| 2004/0013899 A1* | 1/2004 | Abe | 428/655 |
| 2005/0275038 A1* | 12/2005 | Shih et al. | 257/382 |
| 2006/0110867 A1 | 5/2006 | Yabut et al. | 438/151 |
| 2008/0067508 A1 | 3/2008 | Endo et al. | 257/43 |
| 2008/0272370 A1 | 11/2008 | Endo et al. | 257/32 |
| 2009/0065771 A1 | 3/2009 | Iwasaki et al. | 257/43 |
| 2009/0134427 A1 | 5/2009 | Oike et al. | 257/103 |
| 2009/0174012 A1 | 7/2009 | Iwasaki et al. | 257/410 |
| 2009/0189153 A1 | 7/2009 | Iwasaki et al. | 257/43 |
| 2010/0092800 A1 | 4/2010 | Itagaki et al. | 428/697 |
| 2010/0109002 A1 | 5/2010 | Itagaki et al. | 257/43 |

FOREIGN PATENT DOCUMENTS

| | | |
|---|---|---|
| TW | 200511589 | 3/2005 |
| WO | WO 2004/038757 A2 | 5/2004 |
| WO | WO 2006/094231 A1 | 9/2006 |

OTHER PUBLICATIONS

Song et al., "Preparation and Crystallization of Tin—Doped and Undoped Amorphous Indium Oxide Film Deposited by Sputtering", Jpn. J. Appl. Phys., vol. 38, pp. 5224-5226 (1999).*

(Continued)

*Primary Examiner* — Asok Sarkar
(74) *Attorney, Agent, or Firm* — Fitzpatrick, Cella, Harper & Scinto

(57) ABSTRACT

A method for manufacturing a thin film transistor containing an channel layer 11 having indium oxide, including forming an indium oxide film as an channel layer and subjecting the formed indium oxide film to an annealing in an oxidizing atmosphere.

4 Claims, 5 Drawing Sheets

OTHER PUBLICATIONS

Nagatomo et al., "Switching of Evaporated $In_2O_3$ Thin Film on Ferroelectric Ceramics", Japan. J. Appl. Phys., 16(12), pp. 2279 and 2280 (1977).

Fehlner, "Thin Films on Glass for Liquid Crystal Displays", Journal of Non-crystalline Solids, 218, pp. 360-367 (1997).

Fortunato et al., "High Field-effect Mobility Zinc Oxide Thin Film Transistors Produced at Room Temperature", Journal of Non-crystalline Solids, 338-340, pp. 806-809 (2004).

Presley et al., "Tin Oxide Transparent Thin-film Transistors", J. Phys. D: Appl. Phys., 37, pp. 2810-2813 (2004).

Lavareda et al., "Transparent Thin Film Transistors Based on Indium Oxide Semiconductor", Journal of Non-crystalline Solids, 352, pp. 2311-2314 (2006).

Wang et al., "High-performance Transparent Inorganic-Organic Hybrid Thin-Film N-type Transistors", Nature Materials, 5, pp. 893-900 (2006).

PCT International Search Report issued in International Application No. PCT/JP2007/072234.

PCT Written Opinion of the International Searching Authority issued in International Application No. PCT/JP2007/072234.

Wang et al., "High-performance Transparent Inorganic-organic Hybrid Thin-film N-type Transistors", Nature Materials, vol. 5, pp. 893-900 (2006).

Wang et al., "Corrigendum: High-performance Transparent Inorganic-organic Hybrid Thin-film N-type Transistors", Nature Materials, vol. 6, p. 317 (2007).

Nomura et al., "Room-temperature Fabrication of Transparent Flexible Thin-film Transistors Using Amorphous Oxide Semiconductors", Letters to Nature, vol. 432, pp. 488-492 (2005).

Lavareda et al., "Section 2. Transparent Conductors and Semiconductors—Transparent Thin Film Transistors Based on Indium Oxide Semiconductor", Journal of Non-crystalline Solids, 352, pp. 2311-2314 (2006).

Office Action dated Jun. 27, 2011, issued in counterpart Taiwan patent a.n. 096141623, with translation.

* cited by examiner

METHOD FOR MANUFACTURING THIN FILM TRANSISTOR

TECHNICAL FIELD

The present invention relates to a method for manufacturing a field-effect thin film transistor which uses an oxide semiconductor.

BACKGROUND ART

Recently, semiconductor devices which use a metal oxide semiconductor thin film have been drawing attention. This thin film can be deposited at low temperatures and has characteristics such as a large optical band gap and optical transparency to visible light. Such a thin film can also form a flexible, transparent, thin film transistor (TFT) on a plastic substrate or a film or similar substrate.

For example, technology relating to a TFT in which an amorphous oxide film containing indium, zinc and gallium is employed for the channel layer (active layer) is disclosed in Nature, Vol. 432, 25 Nov. 2004 (488-492).

Further, the use of an oxide thin film which uses indium oxide as a main component for a TFT channel layer is disclosed in the Journal of Non-Crystalline Solids, 352, (2006), 2311. However, the atomic composition ratio (O/In) of the indium and oxygen in the oxide thin film is about 2.7, which is far deviated from the chemical stoichiometric ratio of 1.5.

The use of an oxide thin film which uses indium oxide as a main component for a TFT channel layer is also disclosed in Nature materials, VOL. 5, November 2006, (893-900). The indium oxide film is formed by ion-assisted deposition, and a thermal silicon oxide film and an organic thin film are used for the gate insulating film.

Although the TFT disclosed in Nature, VOL. 432, 25 Nov. 2004 (488-492) has a low current on/off ratio of about $10^3$ it has a comparatively high field-effect mobility of 6 to 9 $cm^2$/Vs, and is thus expected to be applied for a desirable active matrix in flat panel displays using liquid crystals or electroluminescence. However, with this TFT, various elements including indium, zinc, gallium and oxygen are used as the main constituent elements of the amorphous oxide film used for the channel layer. Thus, the TFT characteristics vary considerably depending on the composition.

From the standpoint of composition ratio controllability, the types of oxide composition elements are preferably as few as possible.

On the other hand, the TFT using indium oxide thin film for the channel layer disclosed in the Journal of Non-Crystalline Solids, 352, (2006), 2311, has a low current on/off ratio of about $10^4$ and a field-effect mobility of about 0.02 $cm^2$/Vs. As a result, this TFT is not suitable for high-speed operations and hence can be used in limited applications.

In the TFT using an indium oxide thin film for an channel layer disclosed in Nature materials, VOL. 5, November 2006, (893-900), an organic thin film having a high dielectric constant is used for the gate insulating film. The obtained TFT exhibits excellent characteristics, with an S-value ("S-value" being the gate voltage in the subthreshold region wherein the drain current is varied by one order of magnitude with the drain voltage constant) of 0.09 to 0.15 V/decade and a field-effect mobility of 120 to 140 $cm^2$/Vs. However, as discussed above, because the gate insulating film is formed from an organic material, there is the problem that its environmental stability are lower than that of a TFT formed from an inorganic material. Further, while Nature materials, VOL. 5, November 2006 describes a TFT which uses thermal silicon oxide for the gate insulating film, and although the field-effect mobility in this case is about 10 $cm^2$/Vs, which is comparatively high, regarding the subthreshold characteristics it has a large S-value of 5.6 V/decade. Therefore, its applications as a switching TFT are limited.

DISCLOSURE OF THE INVENTION

To solve the above-described problems, the present invention provides a method for manufacturing a thin film transistor including an channel layer comprised of indium oxide, comprising forming an indium oxide film to be said channel layer and subjecting the formed indium oxide film to an annealing (a heat treatment) in an oxidizing atmosphere.

It is noted that the meaning of "comprised of indium oxide" includes cases where impurities are contained to the extent that electrical characteristics are not substantially affected.

Further features of the present invention will become apparent from the following description of exemplary embodiments with reference to the attached drawings.

BEST MODES FOR CARRYING OUT THE INVENTION

Figure 1:
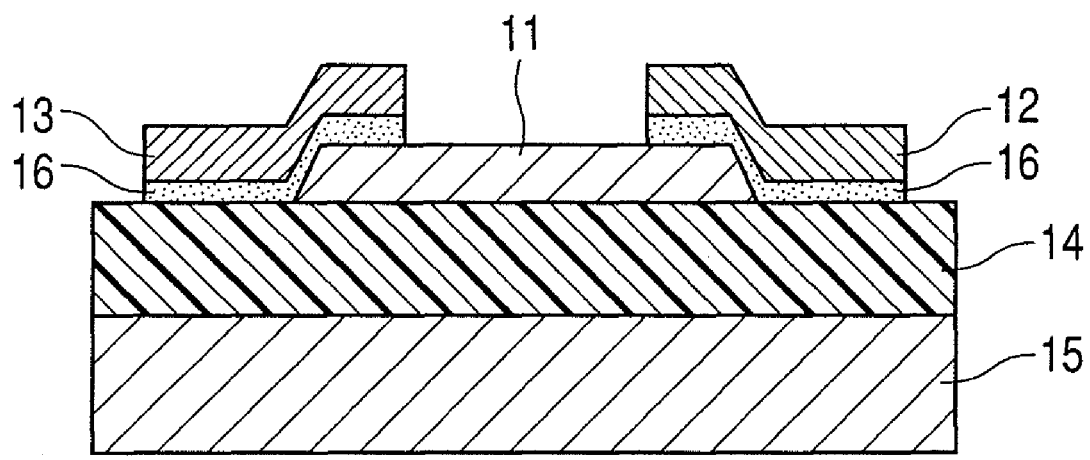
FIG. 1 is a diagram (cross-sectional view) illustrating a structural example of the thin film transistor according to the present invention.

An embodiment of the present invention will now be described while referring to the drawings.

FIG. 1 schematically illustrates the structure of a TFT device according to the present embodiment. The thin film transistor (TFT) is comprised of a gate insulating film 14 arranged on a gate electrode 15 as well as a source electrode 12 and a drain electrode 13 each arranged on the gate insulating film 14. The gate electrode 15 may serve also as a substrate, like phosphorus-doped silicon, or may be formed on a substrate such as glass.

Figure 2:
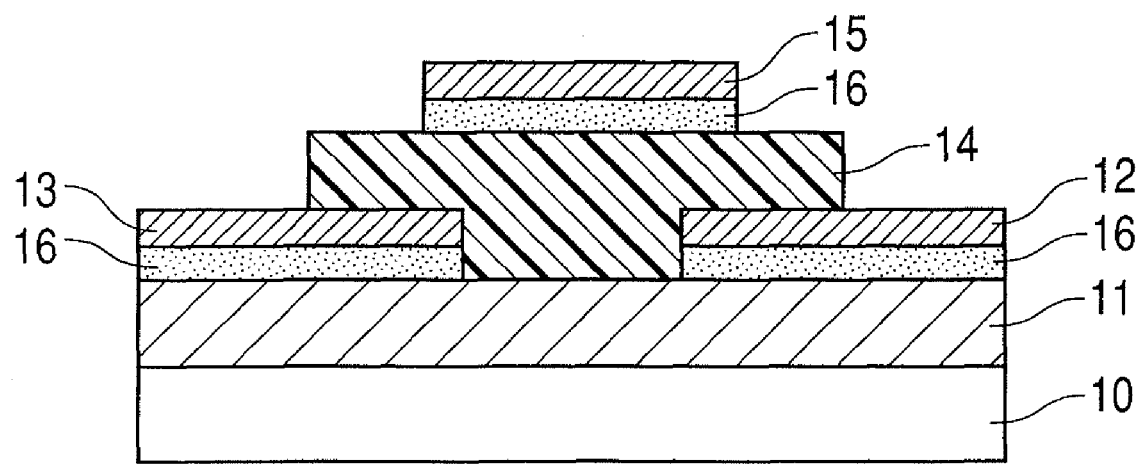
FIG. 2 is a diagram (cross-sectional view) illustrating a structural example of the thin film transistor according to the present invention.

The structure of the semiconductor device which can be used in the present embodiment is not limited to a TFT having such an inverted stagger (bottom gate type) structure. A TFT having a staggered structure (top gate type) including a gate insulating film and a gate electrode on the channel layer (active layer) in this order as illustrated in FIG. 2, for example, may also be used. Especially in the case of a TFT having a staggered structure, there is an advantage that excellent interface characteristics for the gate insulating film and the channel layer can be obtained.

The method for manufacturing the TFT according to the present embodiment will now be described in more detail.

First, the gate electrode 15 is prepared. The material for the gate electrode 15 is not especially limited, so long as it has good electrical conductance and is capable of electrical connection with the channel layer. For example, a material serving both as a gate electrode and a substrate, like phosphorus-doped silicon, can be used. Further, an indium oxide film doped with tin, a transparent conductive film such as zinc oxide or a metal film of gold, platinum, aluminum, nickel and the like formed on a substrate such as glass may also be used. Although the substrate depends on the below-described annealing (heat treatment) conditions, examples of the substrate include glass substrates, metal substrates, plastic substrates and plastic films.

Examples of the gate insulating film 14 include a commonly-used silicon oxide film, silicon nitride film and silicon oxynitride film, as well as alumina or yttria, which have a high dielectric constant, or a film in which these materials are laminated.

Next, an indium oxide film to serve as an channel layer is formed on the gate insulating layer 14 (first step), and then the formed indium oxide film is subjected to an annealing in an oxidizing atmosphere (second step).

(First Step)

The indium oxide film is deposited by a vapor deposition such as sputtering, pulsed laser deposition, resistance heating deposition, electron beam deposition and atomic layer deposition, or by a combination of such methods.

TFT characteristics such as field-effect mobility, current on/off ratio and subthreshold characteristics are greatly affected by the surface flatness of the indium oxide film which will serve as the channel layer. In particular, it is known that the above-described TFT characteristics dramatically deteriorate when the root mean square of surface roughness (Rrms) exceeds 1 nm. Accordingly, to realize a TFT having excellent initial characteristics, an indium oxide film having high surface flatness needs to be deposited.

In view of this, the present inventors investigated the relationship between the flatness of an oxide film and the deposition conditions, whereupon the inventors found that there is a correlation between the gas pressure during deposition and the surface roughness of the oxide film. For example, for a vacuum deposition method such as resistance heating deposition or electron beam deposition, an indium oxide film having an Rrms of 1 nm or less can be realized if deposition is conducted at 0.1 Pa or less. For sputtering or pulsed laser deposition, an indium oxide film having an Rrms of 1 nm or less can be realized if deposition is conducted at 6.5 Pa or less.

In the TFT disclosed in the Journal of Non-Crystalline Solids, 352, (2006), 2311, the indium oxide thin film is formed by resistance heating deposition in an atmosphere having an oxygen gas pressure of 0.17 Pa, and thus the surface roughness would be expected to be large. This surface roughness is thought to be one reason why good characteristics were not obtained for the TFT disclosed in that publication.

The deposited indium oxide thin film may be crystalline such as polycrystals and microcrystals, or may be amorphous. It was found from experiments carried out by the present inventors that excellent surface flatness can be realized even if the indium oxide film was deposited under such conditions that an amorphous film is formed. In the below-described second step, the indium oxide film obtained in the first step is subjected to an annealing. At this stage, an indium oxide film deposited under the conditions wherein an amorphous film is formed has an especially lower surface roughness even after annealing than an indium oxide film deposited under the conditions wherein a crystal film is formed, thereby realizing a TFT having excellent interface characteristics. In particular, a TFT having excellent subthreshold characteristics with a small S-value ("S-value" being the gate voltage in the subthreshold region when the drain current is varied by one order of magnitude with the drain voltage constant) can be obtained.

Although the conditions under which an amorphous indium oxide film is obtained depend on the deposition method and deposition apparatus, basically an amorphous indium oxide film can be obtained by maintaining the substrate at a temperature that is lower than the crystallization temperature, specifically, 150° C. or less.

Figure 3:
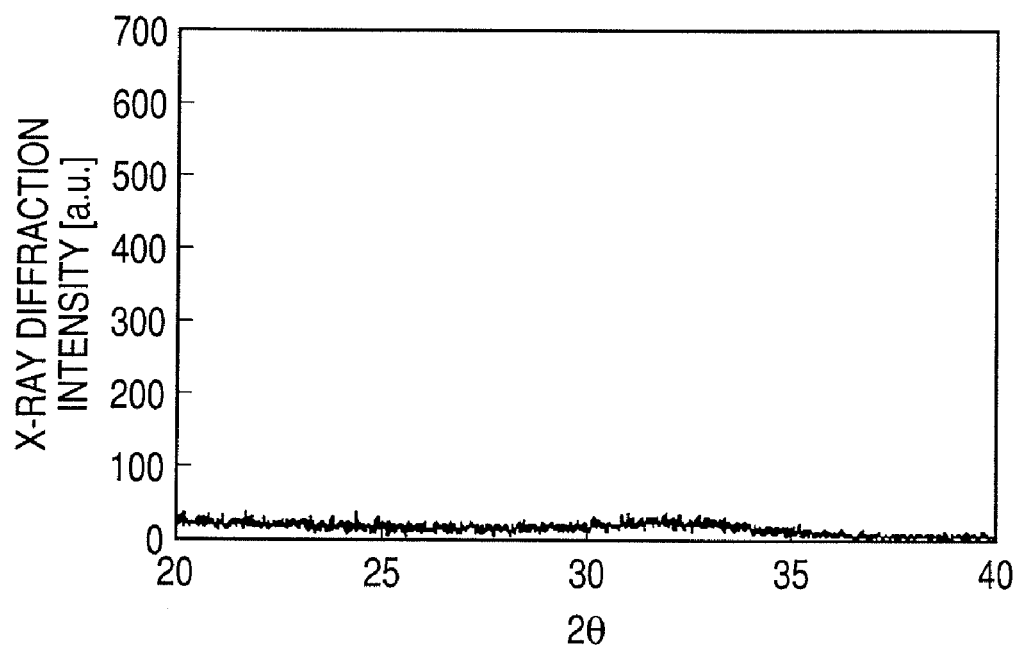
FIG. 3 is a graph illustrating the X-ray diffraction spectrum of the amorphous indium oxide thin film according to the present invention.

In the case of depositing indium oxide by sputtering, crystallization can sometimes be promoted as a result of high-energy particles coming from the target or from the gas phase. Accordingly, the distance between the substrate and the target is increased or the gas pressure is increased as necessary. Here, whether the film is amorphous or not can be confirmed by the absence of a clear diffraction peak (i.e. a halo pattern is observed) when X-ray diffraction of the subject thin film is carried out at a small incident angle of about 0.5°. FIG. 3 illustrates a typical X-ray diffraction spectrum of the amorphous indium oxide film according to the present invention.

Further, according to findings discovered by the present inventors, a thin film transistor which uses indium oxide for the channel layer can be made to have especially good TFT characteristics by using an oxide film which has an electrical resistivity of 1 $\Omega$cm or more to 100 k$\Omega$cm or less. If the electrical resistivity is not within the above range, the following problems can occur. That is, if the electrical resistivity is less than 1 $\Omega$cm, the TFT current on/off ratio cannot be increased. In an extreme case, the current between the source and drain electrodes does not turn on/off even by applying a gate voltage, whereby the TFT fails to exhibit transistor operation. On the other hand, if the electrical resistivity is more than 100 k$\Omega$cm, the on-current cannot be increased. In an extreme case, the current between the source and drain electrodes does not turn on/off even by applying a gate voltage, whereby the TFT fails to exhibit transistor operation.

In the present embodiment, the electrical resistivity of the indium oxide film is controlled by controlling the introduced oxygen partial pressure to 1 Pa or less and by carrying out the below-described annealing in an oxidizing atmosphere in the second step.

In particular, if deposition is carried out with an introduced oxygen partial pressure in the indium oxide film deposition step of 0.01 Pa or less, the electrical resistivity is determined by the annealing carried out after indium oxide film deposition, which obviates the need to precisely control the oxygen partial pressure in the deposition atmosphere. Further, by carrying out the deposition under such conditions that the electrical resistivity of the indium oxide film is lower than the resistivity (1 $\Omega$cm) exhibiting good characteristics as a TFT channel layer, damage to the film caused by oxygen ions during deposition can be reduced; thus, a TFT having excellent characteristics can be obtained.

For example, in the case of carrying out deposition by sputtering, if the amount of the introduced oxygen is reduced, the amount of negative oxygen ions generated at the target surface decreases, so that the amount of high-energy negative oxygen ions incident on the substrate decreases. This allows the film quality to be prevented from deteriorating. Further, since not many oxygen radicals or high-energy negative oxygen ions are present in the deposition atmosphere, there are advantages that the electrical characteristics of the formed film are not affected by the distance from the target and that the process margin can be enlarged. These advantages are especially prominent when using a sputtering method, although this is thought to be because the degree of dissociation of the molecular gases in the gas phase is higher than that for the other gas phase methods. The above-described advantages are also prominent when the introduced oxygen partial pressure is 0 Pa. Therefore, the lower limit of the introduced oxygen partial pressure in the present embodiment is 0 Pa.

On the other hand, if the introduced oxygen partial pressure in the indium oxide deposition step is made to exceed a pressure of 1 Pa, uneven portions are formed on the surface of the indium oxide film, which is not desirable as the interface characteristics deteriorate and field-effect mobility is reduced.

The term "introduced oxygen partial pressure" refers to the partial pressure of the oxygen which is deliberately introduced into the deposition apparatus by a flow rate controller. Therefore, this term does not include so-called "contamination" such as oxygen which is inevitably released from the walls in the deposition apparatus, oxygen which enters from outside due to a leak in the deposition apparatus, or oxygen which is released from the target. Obviously, under such conditions that the residual oxygen gas pressure exceeds the above-described oxygen pressure upper limit, it becomes more difficult to obtain the above-described advantages, and thus the back pressure of the deposition apparatus used in the present embodiment is preferably 0.001 Pa or less. The flow rate controller may be, for example, a mass flow controller.

(Second Step)

After the above-described first step, the formed indium oxide film is heat treated to form a channel layer (active layer) 11. The annealing may be carried out after deposition of the indium oxide film, or after deposition of the electrode films such as the drain electrode 13, source electrode 12 and gate electrode 15.

In the present embodiment, the step of forming the indium oxide film can be carried out in an oxygen atmosphere that has less oxygen than the oxidizing atmosphere in the annealing step. This is to reduce the damage to the film caused by oxygen ions during deposition of the indium oxide film. On the other hand, because in the second step the oxygen ions which damage the deposited film are present in only a small amount or not at all, there is no particular upper limit on the amount of oxygen in the atmosphere. Thus, by reducing damage (defects etc.) in the film formed in the first step, the annealing effects of the second step are further increased.

In the present embodiment, for the second step (annealing step) the treatment temperature can be adjusted according to the introduced oxygen partial pressure of the first step (indium oxide deposition step).

If the introduced oxygen partial pressure in the first step exceeded 0.01 Pa but was less than 0.1 Pa, the indium oxide film is subjected to the annealing at a temperature higher than the crystallization temperature, specifically, 150° C. or higher, so that the film turns into crystals such as polycrystals or microcrystals.

As a result of this, the crystallinity of the indium oxide improves and the electrical characteristics of the film stabilize, thereby realizing a TFT having excellent reliability. Crystallinity of an indium oxide film subjected to annealing at less than 150° C. is almost identical to that of the film after the first step, so that only a film which is amorphous or which has low crystallinity can be obtained. Further, according to the finding of the present inventors, although the resistivity of an indium oxide film heat treated at a temperature lower than 150° C. and left to stand in air has an initial value of from 10 to 100 kΩcm, this always decreases to 1 Ωcm 3 months later. For a TFT which uses such an indium oxide film for its channel layer, the off-current cannot be reduced by applying a gate voltage, and transistor operation is not exhibited.

Figure 4:
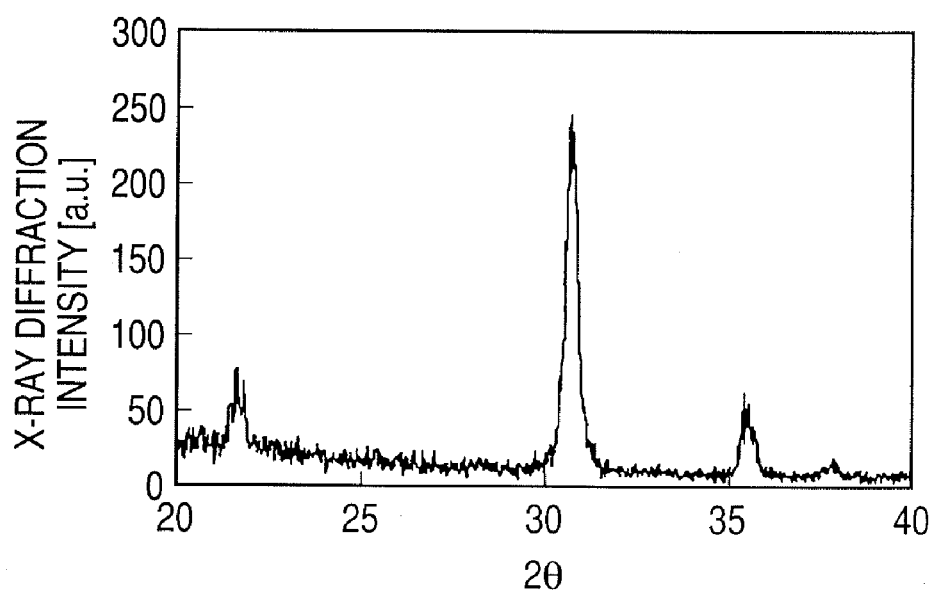
FIG. 4 is a graph illustrating the X-ray diffraction spectrum of the indium oxide thin film according to the present invention after annealing.

On the other hand, if an indium oxide film having an initial resistivity of from 10 to 100 kΩcm is subjected to an annealing at 150° C. or more, almost no change over time is observed even after being left to stand for one month. A TFT which uses such an indium oxide film for its channel layer has a small off-current, and can obtain a current on/off ratio that is higher than that of a TFT which uses a conventional oxide semiconductor for its channel layer. Here, while in some cases microcrystals may be contained in the indium oxide film, as long as no clear diffraction peak is found in X-ray diffraction at a low incident angle of 0.5°, the film is not considered as being a crystal. FIG. 4 illustrates a typical X-ray diffraction spectrum of the indium oxide thin film according to the present invention after annealing. The upper limit of the annealing temperature may be set as appropriate, although an upper limit lower than the glass transition temperature at which thermal deformation of the substrate occurs is preferred. For example, the annealing is preferably carried out at 450° C. or less in the case of a glass substrate, and at 200° C. or less in the case of a plastic substrate.

Further, at this point the annealing conditions can be set so that the indium oxide film has a resistivity which exhibits good characteristics as a TFT channel layer.

On the other hand, if the introduced oxygen partial pressure in the first step is 0.01 Pa or less, or 0.1 Pa or more to 1 Pa or less, the treatment temperature in the second step can be controlled within the following temperature range according to the treatment conditions (treatment atmosphere).

According to the findings of the present inventors, if indium oxide having a resistivity of 1 Ωcm or less or of 100 kΩcm or more is subjected to an annealing in an atmosphere containing any of oxygen, oxygen radicals, ozone, water vapor or nitrogen oxide, the resistivity hardly changes at temperatures less than 250° C. Therefore, for an annealing under temperature conditions of less than 250° C., good characteristics as a channel layer cannot be obtained. On the other hand, at 250° C. or more, the film resistivity changes in the range of from 10 Ωcm to 100 kΩcm, so that good characteristics as a channel layer can be obtained.

The upper limit of the annealing temperature may be set as appropriate, although an upper limit lower than the glass transition temperature at which thermal deformation of the substrate occurs is preferred. For example, the annealing is preferably carried out at 450° C. or less in the case of a glass substrate.

If indium oxide having a resistivity of 1 Ωcm or less or of 100 kΩcm or more is exposed to UV irradiation in an atmosphere containing ozone or oxygen radicals, the resistivity hardly changes at temperatures less than 150° C. Therefore, for an annealing under temperature conditions of less than 150° C., good characteristics as a channel layer cannot be obtained. On the other hand, at 150° C. or more, the resistivity changes in the range of from 10 Ωcm to 100 kΩcm, so that good characteristics as a channel layer can be obtained. The upper limit of the annealing temperature may be set as appropriate, although an upper limit lower than the glass transition temperature at which thermal deformation of the substrate occurs is preferred. For example, the annealing is preferably carried out at 450° C. or less in the case of a glass substrate, and at 200° C. or less in the case of a plastic substrate.

Therefore, to effectively control resistivity, in the case of carrying out the annealing in an oxidizing atmosphere containing any of oxygen, ozone, water vapor or nitrogen oxide, the annealing can be carried out at a temperature of 250° C. or more to 450° C. or less.

Further, in the case of carrying out the annealing by UV irradiation in an oxidizing atmosphere containing ozone or oxygen radicals, the annealing can be carried out at a temperature of 150° C. or more to 450° C. or less.

It is noted that the indium oxide film may contain impurities to the extent that TFT characteristics such as field-effect mobility, current on/off ratio and subthreshold characteristics are not substantially affected.

The material for the source electrode 12 and drain electrode 13 each formed on the indium oxide film which serves as the channel layer 11 is not particularly limited, so long as it has good electrical conductance and is capable of electrical connection with the channel layer. For example, an indium oxide film doped with tin, a transparent conductive film such as zinc oxide or a metal film of gold, platinum, aluminum, nickel and the like may be used. Further, an adhesion layer 16 including titanium, nickel, chromium or the like may also be formed to improve the adhesion between the channel layer and the electrodes.

(TFT Characteristics)

First, the evaluation index for the transistor operation characteristics will be described.

Figure 5:
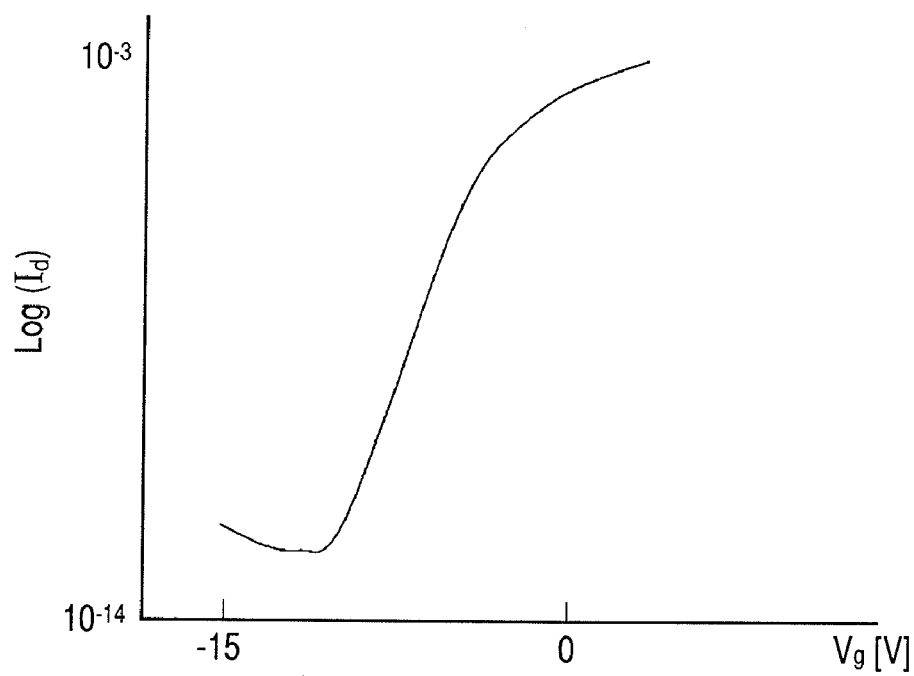
FIG. 5 is a graph illustrating typical TFT characteristics of the thin film transistor according to the present invention.

FIG. 5 illustrates typical characteristics of the thin film transistor according to the present embodiment.

When a voltage Vd of about 6 V is applied between the source and drain electrodes, the current Id between the source and drain electrodes can be controlled (turned on/off) by switching the gate voltage Vg between −5V and 5V.

Examples of the various evaluation items for transistor characteristics include field-effect mobility μ, threshold voltage (Vth), on/off ratio and S-value.

Field-effect mobility can be determined from the characteristics of the linear region or saturated region. For example, one way is to make a graph of √Id–Vg from the results of the transfer characteristics and derive the field-effect mobility from the gradient. Unless stated otherwise, in the present specification evaluation is carried out using this technique.

There are several ways to determine threshold voltage, one example being to derive the threshold voltage Vth from the x-intercept of the √Id–Vg graph.

The on/off ratio can be determined from the ratio between the greatest Id and the smallest Id in the transfer characteristics.

In addition, the S-value can be determined by making a graph of Log(Id)–Vd from the results of the transfer characteristics and deriving the value from the reciprocal of the gradient.

The unit for the S-value is V/decade, and a smaller value is preferable.

With the TFT according to the present embodiment, a higher on-current and a higher field-effect mobility is obtained than with a TFT which uses conventional indium oxide for the channel layer or a TFT which uses an amorphous oxide film containing indium, zinc and gallium for the channel layer. On the other hand, the off-current is very small, and thus the current on/off ratio is remarkably improved compared with that of the above-described conventional TFTs.

The channel layer comprised of indium oxide as used in the present invention includes cases where impurities are contained to the extent that the above-described electrical characteristics are not substantially affected. For example, the channel layer may contain such impurities in an amount of 1 atomic percent or less for the case of hydrogen or rare gases such as argon, in an amount of 0.1 atomic percent or less for the case of fluorine, or in an amount of 0.01 atomic percent or less for the case of chlorine or nitrogen.

EXAMPLES

The present invention will now be described in more detail with the following examples.

Example 1

A first example of a TFT device manufactured by the method according to the present invention will be described using FIG. 1.

In the present example, a silicon substrate doped with phosphorus was used as the gate electrode 15 and an approximately 100 nm thermal silicon oxide film was used for the gate insulating film 14. An indium oxide film was formed on the thermal silicon oxide film as the channel layer 11.

In the present example, the indium oxide film was formed by sputtering deposition in an argon-oxygen mixed atmosphere and by an annealing in air.

Figure 6:
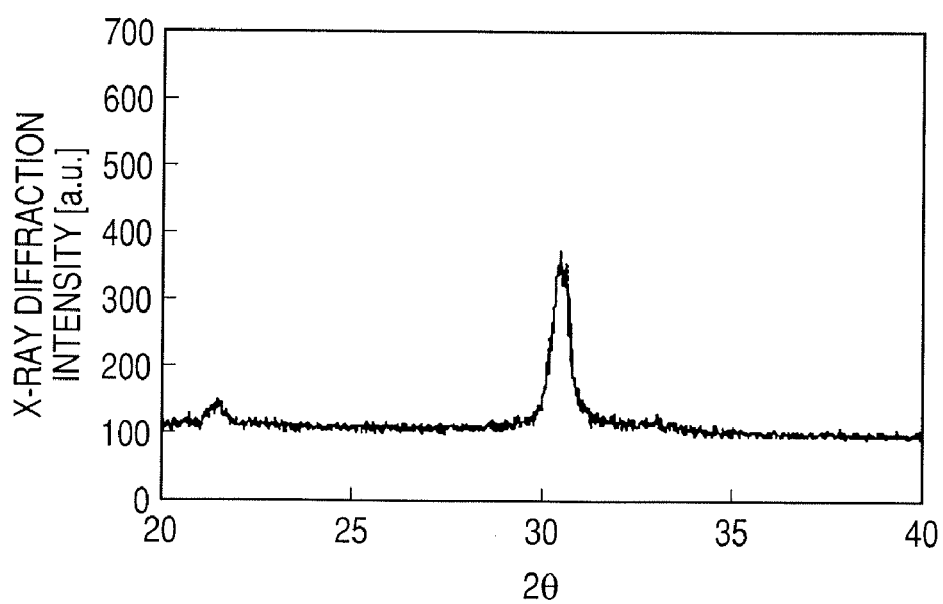
FIG. 6 is a graph illustrating the X-ray diffraction spectrum of the indium oxide thin film formed in Example 1 immediately after deposition.

A target made of a sintered material having a composition of $In_2O_3$ (99.9% purity) was used as the target (material source), and the applied RF power was set at 20 W. The distance between the target and the substrate was about 7 cm. An indium oxide film was formed in a $4\times10^{-1}$ Pa argon-oxygen mixed gas atmosphere, wherein the introduced oxygen partial pressure was set at $1\times10^{-2}$ Pa. The substrate temperature during film formation was 25° C. and the film deposition rate was 5 nm/min. When the X-ray diffraction of the formed indium oxide film was measured at an incident angle of 0.5° to the film surface, an $In_2O_3$ diffraction peak was found, thereby confirming that the formed indium oxide film had crystallized. The obtained X-ray diffraction spectrum is illustrated in FIG. 6.

Then, using electron beam heating deposition, an approximately 5 nm-thick titanium layer and an approximately 100 nm-thick gold layer were successively layered from the side near the channel layer, and then a source electrode 12 and a drain electrode 13 were formed by photolithography and a lift-off technique. The channel length was 10 μm and the channel width was 150 μm.

Figure 7:
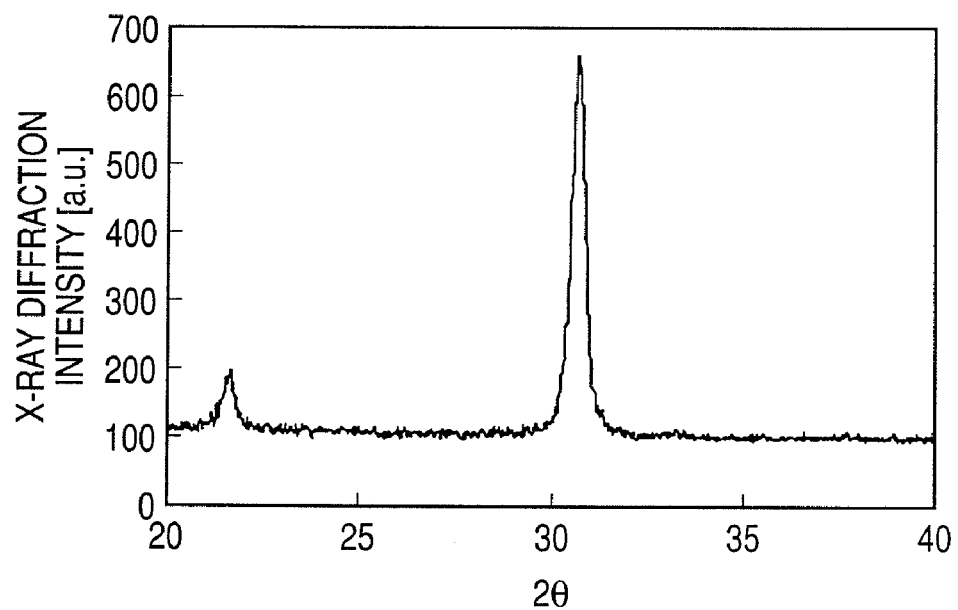
FIG. 7 is a graph illustrating the X-ray diffraction spectrum of the indium oxide thin film formed in Example 1 after annealing.

Next, the thus-manufactured TFT was subjected to a one-hour annealing in an air atmosphere of 300° C. It was found from a four-probe measurement of the finally-obtained indium oxide film that the resistivity after the annealing was 10 kΩcm. Additionally, X-ray reflectance measurement and spectral ellipsometry were conducted. Analysis of the resultant patterns showed that the root mean square roughness (Rrms) of the indium thin film was about 0.8 nm, and that the film thickness was about 60 nm. Further, observation with a scanning electron microscope (SEM) showed that the particle size of the indium oxide film was about 10 nm. From Rutherford backscattering (RBS) analysis it was found that the atomic composition ratio (O/In) of the indium and the oxygen was in the range of 1.3 to 1.7. In addition, when the X-ray diffraction of the formed indium oxide film was measured at an incident angle of 0.5° to the film surface, an $In_2O_3$ diffraction peak was found, thereby confirming that the formed indium oxide film had crystallized. The obtained X-ray diffraction spectrum is illustrated in FIG. 7.

Comparative Example 1

While the structure was the same as in Example 1, in the present Comparative Example 1 the annealing in an air atmosphere of 300° C. after formation of the source and drain electrodes was not carried out. The obtained film had a resistivity of 10 kΩcm, an Rrms of about 0.75 nm and a particle size of about 10 nm. Further, it was found from X-ray diffraction that the formed indium oxide film had crystallized.

Comparative Example 2

Except for the channel layer, the structure was the same as in Example 1. The indium oxide film was formed in a $5\times10^{-1}$ Pa oxygen gas atmosphere by resistance heating deposition. An indium pellet was used as the vapor deposition source. The distance from the vapor deposition source to the substrate was about 30 cm. The thickness of the formed indium oxide film was about 60 nm, and the substrate temperature during film formation was 25° C. Further, after the source and drain electrodes had been formed, a one-hour annealing in an air atmosphere of 300° C. was carried out. The heat treated indium oxide film had a resistivity of 10 kΩcm, an Rrms of about 3 nm and a particle size of about 25 nm. Further, it was found from X-ray diffraction that the formed indium oxide film had crystallized.

(TFT Device Characteristics Evaluation)

Figure 8:
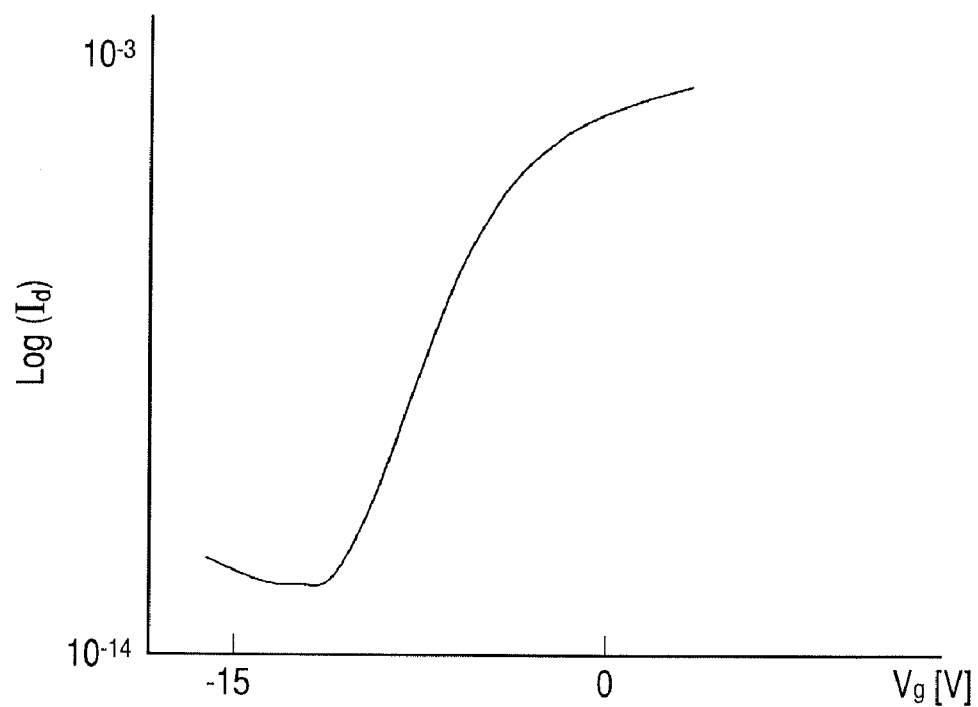
FIG. 8 is a graph illustrating typical TFT characteristics of the thin film transistor manufactured in Example 1.

FIG. 8 illustrates the Id–Vg characteristic (transfer characteristic) at Vd=6 V when the TFT device manufactured in the present example was measured at room temperature. The TFT device manufactured in the present example had a larger on-current than the device in Comparative Example 2, and when Vg=10 V, it can be seen that a current of about Id=$8\times10^{-4}$ A was flowing. Calculation of field-effect mobility from the output characteristics gave a value of about 25 cm$^2$/Vs in the saturated region, which was about ten times higher than in Comparative Example 2. In addition, the TFT device manufactured in the present example exhibited a very small off-current, so that the current on/off ratio was about $10^8$, which was higher by a magnitude of about 2 compared with Comparative Example 2. The S-value was about 1.5 V/dec.

It is noted that for the TFT manufactured in Comparative Example 1, the off-current did not decrease even by applying a gate voltage, that is, the current between the source and the drain electrodes did not turn on/off, so that a transistor operation was not exhibited. Although the reason for this is not clear, it is believed that the transistor characteristics of a TFT which has not been subjected to an annealing deteriorate due to the formation of undesirable oxygen defect levels, impurity levels and the like.

Thus, an channel layer having an Rrms of 0.8 nm and high surface flatness can be realized through deposition of an indium oxide film by sputtering in a $4\times10^{-1}$ Pa argon-oxygen mixed gas atmosphere. Further, electrical characteristics are stabilized by subjecting the indium oxide film to a one-hour annealing in an air atmosphere of 300° C. Still further, by using such a film for a TFT channel layer, the TFT was realized exhibiting excellent characteristics of a field-effect mobility of about 25 cm$^2$/Vs and a current on/off ratio of $10^8$.

Example 2

A second example of a TFT device manufactured by the method according to the present invention will be described using FIG. 1.

In the present example, a silicon substrate doped with phosphorus was used as the gate electrode 15 and an approximately 100 nm thermal silicon oxide film was used for the gate insulating film 14. An indium oxide film was formed on the thermal silicon oxide film as the channel layer 11.

In the present example, the indium oxide film was formed by sputtering deposition in an argon-oxygen mixed atmosphere and by an annealing in air.

A target having a composition of In$_2$O$_3$ (99.9% purity) was used as the target (material source), and the applied RF power was set at 20 W. The distance between the target and the substrate was about 9 cm. An indium oxide film was formed in a $4\times10^{-1}$ Pa argon-oxygen mixed gas atmosphere, wherein the introduced oxygen partial pressure was set at $1\times10^{-2}$ Pa. The substrate temperature during film formation was 25° C. and the film deposition rate was 3 nm/min. When the X-ray diffraction of the formed indium oxide film was measured at an incident angle of 0.5° to the film surface, a clear diffraction peak was not found, thereby confirming that the formed indium oxide film was amorphous. The obtained X-ray diffraction spectrum is illustrated in FIG. 3.

Then, using electron beam heating deposition, an approximately 5 nm-thick titanium layer and an approximately 100 nm-thick gold layer were successively layered from the side near the channel layer, and then a source electrode 12 and a drain electrode 13 were formed by photolithography and a lift-off technique. The channel length was 10 μm and the channel width was 150 μm.

Next, the thus-manufactured TFT was subjected to a one-hour annealing in an air atmosphere of 300° C. It was found from a four-probe measurement of the indium oxide film that the resistivity after the annealing was about 100 Ωcm. Further, when the X-ray diffraction of the indium oxide film was measured at an incident angle of 0.5° to the film surface, an In$_2$O$_3$ diffraction peak was found, thereby confirming that the formed indium oxide film had crystallized. The obtained X-ray diffraction spectrum is illustrated in FIG. 4. Additionally, X-ray reflectance measurement and spectral ellipsometry were conducted. Analysis of the resultant patterns showed that the root mean square roughness (Rrms) of the indium thin film was about 0.4 nm, and that the film thickness was about 40 nm. Further, it was found from SEM observation that the particle size of the indium oxide film was about 12 nm, and from RBS analysis that the atomic composition ratio (O/In) of the indium and the oxygen was in the range of 1.3 to 1.7.

Comparative Example 3

While the structure was the same as in Example 2, in the present Comparative Example 3 the annealing in an air atmosphere of 300° C. after formation of the source and drain electrodes was not carried out. The obtained film had a resistivity of about 40 Ωcm and Rrms of about 0.3 nm. Further, it was found from X-ray diffraction that the formed indium oxide film was amorphous.

(TFT Device Characteristics Evaluation)

Measurement of the TFT device manufactured in the present example at room temperature showed that the field-effect mobility was about 28 cm$^2$/Vs and the current on/off ratio was about $4\times10^8$, which were higher values than in Example 1. In addition, a transistor having good characteristics was realized, in which the subthreshold characteristics were also improved with an S-value of about 1.0 V/dec.

It is noted that for the TFT manufactured in Comparative Example 3, the off-current did not decrease even by applying a gate voltage, that is, the current between the source and the drain electrodes did not turn on/off, so that a transistor operation was not exhibited. Although the reason for this is not clear, it is believed that the transistor characteristics of a TFT which has not been subjected to an annealing deteriorate due to the formation of undesirable oxygen defect levels, impurity levels and the like.

Thus, an indium oxide film having an Rrms of 0.4 nm, which is an especially good surface flatness, can be realized through deposition of an indium oxide film under such conditions that an amorphous film is formed. Further, the electrical characteristics of the indium oxide film are stabilized by subjecting the film to a one-hour annealing in an air atmosphere of 300° C. Still further, by using such an indium oxide film for a TFT channel layer, a TFT was realized exhibiting excellent characteristics of a field-effect mobility of about 28 $cm^2/Vs$, a current on/off ratio of $4\times10^8$ and an S-value of about 1.0 V/dec.

Example 3

A third example of a TFT device manufactured by the method according to the present invention will be described using FIG. 1.

In the present example, a silicon substrate doped with phosphorus was used as the gate electrode 15 and an approximately 100 nm thermal silicon oxide film was used for the gate insulating film 14. An indium oxide film was formed on the thermal silicon oxide film as the channel layer 11.

In the present example, the indium oxide film was formed by sputtering deposition in an argon-oxygen mixed atmosphere and by an annealing in air.

A target having a composition of $In_2O_3$ (99.9% purity) was used as the target (material source), and the applied RF power was set at 20 W. The distance between the target and the substrate was about 12 cm. An indium oxide film was formed in a $4\times10^{-1}$ Pa argon-oxygen mixed gas atmosphere, wherein the introduced oxygen partial pressure was set at $1\times10^{-2}$ Pa. The substrate temperature during film formation was 25° C. and the film deposition rate was 3 nm/min. When the X-ray diffraction of the formed indium oxide film was measured at an incident angle of 0.5° to the film surface, a clear diffraction peak was not found, thereby confirming that the formed indium oxide film was amorphous.

Then, using electron beam heating deposition, an approximately 5 nm-thick titanium layer and an approximately 100 nm-thick gold layer were successively layered from the side near the channel layer, and then a source electrode 12 and a drain electrode 13 were formed by photolithography and a lift-off technique. The channel length was 10 μm and the channel width was 150 μm.

Figure 9:
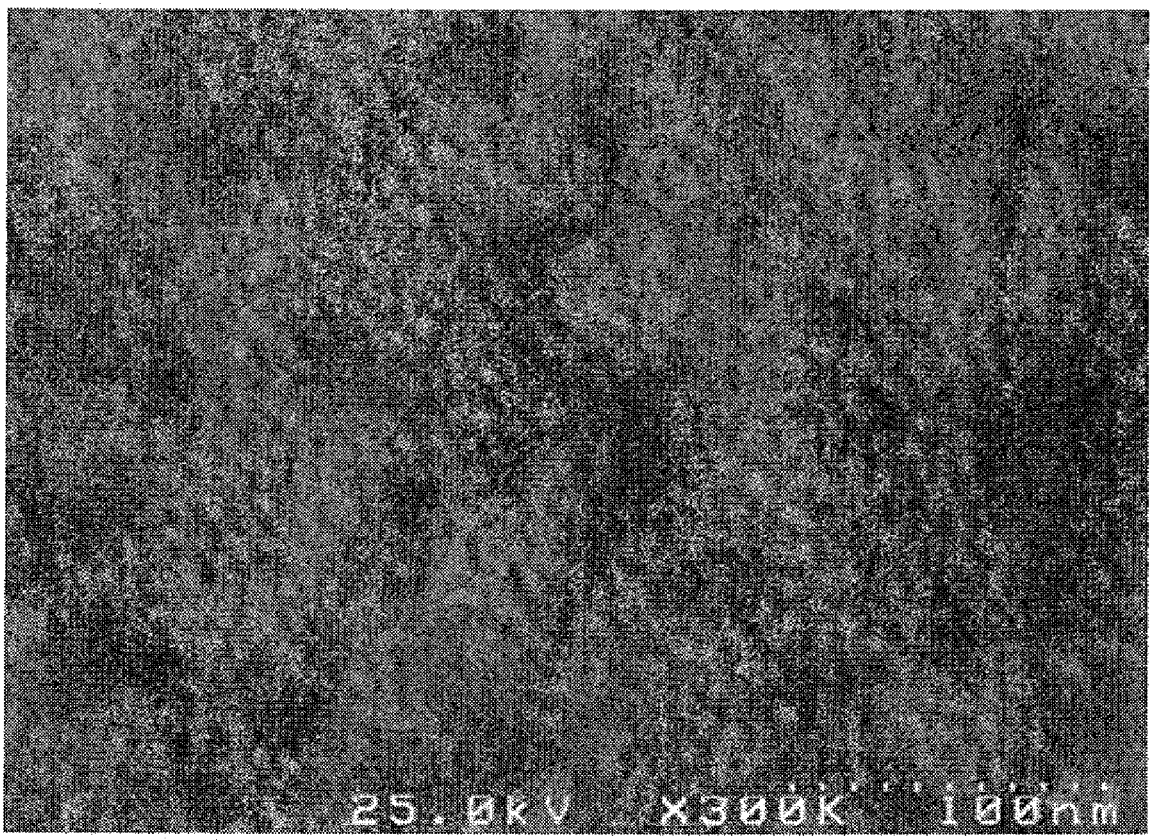
FIG. 9 is a SEM photograph of the indium oxide film obtained in the examples.

Next, the thus-manufactured TFT was subjected to a one-hour annealing in an air atmosphere of 300° C. It was found from a four-probe measurement of the indium oxide film that the resistivity after the annealing was about 10 Ωcm. Further, when the X-ray diffraction of the indium oxide film was measured at an incident angle of 0.5° to the film surface, an $In_2O_3$ diffraction peak was found, thereby confirming that the formed indium oxide film had crystallized. Additionally, X-ray reflectance and spectral ellipsometry were conducted. Analysis of the resultant patterns showed that the root mean square roughness (Rrms) of the indium thin film was about 0.35 nm, and that the film thickness was about 20 nm. Further, it was found from SEM observation that the particle size of the indium oxide film was about 12 nm, and from RBS analysis that the atomic composition ratio (O/In) of the indium and the oxygen was in the range of 1.3 to 1.7. FIG. 9 is a SEM photograph of the indium oxide film obtained in the present example.

Comparative Example 4

While the structure was the same as in Example 3, in the present Comparative Example 4 the annealing in an air atmosphere of 300° C. after formation of the source and drain electrodes was not carried out. The obtained film had a resistivity of about 0.2 Ωcm and Rrms of about 0.3 nm. Further, it was found from X-ray diffraction that the formed indium oxide film was amorphous.

(TFT Device Characteristics Evaluation)

FIG. 5 illustrates the Id-Vg characteristic (transfer characteristic) at Vd=6 V when of the TFT device manufactured in the present example was measured at room temperature. The TFT device manufactured in the present example had a larger on-current than the device of Example 2, with a high field-effect mobility value of 29 $cm^2/Vs$ being obtained. On the other hand, the off-current was small at about $1\times10^{-12}$ A, so as a result that a high current on/off ratio of greater than about $10^9$ was obtained. Still further, a transistor was realized exhibiting excellent characteristics, in which the subthreshold characteristics were also improved with an S-value of about 0.7 V/dec.

It is noted that for the TFT manufactured in Comparative Example 4, the off-current did not decrease even by applying a gate voltage, that is, the current between the source and the drain electrodes did not turn on/off, so that a transistor operation was not exhibited. Although the reason for this is not clear, it is believed that the transistor characteristics of a TFT which has not been subjected to an annealing deteriorate due to the formation of undesirable oxygen defect levels, impurity levels and the like.

Thus, a TFT having a low off-current and a current on/off ratio of greater than about $10^9$ could be realized by setting the thickness of the indium oxide film used as the channel layer 20 nm thin. Further, a TFT was realized having excellent subthreshold characteristics with an S-value of about 0.7 V/dec.

Example 4

A fourth example of a TFT device manufactured by the method according to the present invention will be described using FIG. 2.

First, an indium oxide film was formed on a glass substrate 10 as the channel layer 11.

In the present example, the indium oxide film was formed by sputtering deposition in an argon-oxygen mixed atmosphere and by an annealing in air.

A target having a composition of $In_2O_3$ (99.9% purity) was used as the target (material source), and the applied RF power was set at 20 W. The distance between the target and the substrate was about 12 cm. An indium oxide film was formed in a $4\times10^{-1}$ Pa argon atmosphere, wherein the introduced oxygen partial pressure was set at $1\times10^{-2}$ Pa. The substrate temperature during film formation was 25° C. and the film deposition rate was 3 nm/min. When the X-ray diffraction of the formed indium oxide film was measured at an incident angle of 0.5° to the film surface, a clear diffraction peak was not found, thereby confirming that the formed indium oxide film was amorphous.

Then, using electron beam heating deposition, an approximately 5 nm-thick titanium layer and an approximately 100 nm-thick gold layer were successively layered from the side near the channel layer, and then a source electrode 12 and a drain electrode 13 were formed by photolithography and a lift-off technique.

Next, the indium oxide film formed by sputtering was subjected to a one-hour annealing in an air atmosphere of 300° C. It was found from a four-probe measurement of the obtained film that the resistivity was 100 Ωcm. Further, when the X-ray diffraction of the indium oxide film was measured at an incident angle of 0.5° to the film surface, an $In_2O_3$ diffraction peak was found, thereby confirming that the formed indium oxide film had crystallized. Additionally, X-ray reflectance measurement and spectral ellipsometry were conducted. Analysis of the resultant patterns showed that the root mean square roughness (Rrms) of the thin film was about 0.35 nm, and that the film thickness was about 20 nm. It was found from SEM observation that the particle size of the indium oxide film was about 12 nm, and from RBS analysis that the atomic composition ratio (O/In) of the indium and the oxygen was in the range of 1.3 to 1.7.

Next, the silicon oxide film used as the gate insulating film 14 was deposited to a thickness of about 90 nm by electron beam deposition. A titanium layer and a gold layer were then successively layered thereon, and a gate electrode 15 was formed by photolithography and a lift-off technique. The channel length was 10 μm and the channel width was 150 μm.

Comparative Example 5

Except for the channel layer, the structure was the same as in Example 4. The indium oxide film was formed in a $1\times10^{-1}$ Pa oxygen gas atmosphere by resistance heating deposition. An indium pellet was used as the vapor deposition source. The distance from the vapor deposition source to the substrate was about 30 cm. The thickness of the formed indium oxide film was about 20 nm, and the substrate temperature during film formation was 25° C. Further, after the source and drain electrodes had been formed, a one-hour annealing in an air atmosphere of 300° C. was carried out. The heat treated indium oxide film had a resistivity of 700 Ωcm, an Rrms of about 2 nm and a particle size of about 23 nm. Further, it was found from X-ray diffraction that the formed indium oxide film had crystallized.

(TFT Device Characteristics Evaluation)

Compared with Comparative Example 5, the on-current was larger, and when Vg=10 V, a current of about $Id=1\times10^{-3}$ A was flowing. Calculation of the field-effect mobility from the output characteristics gave a value of about 20 $cm^2/Vs$ in the saturated region, which was about 40 times higher than in Comparative Example 5. In addition, the transistor on/off ratio also exceeded $10^7$, which was higher by a magnitude of about 2 compared with Comparative Example 5. The sub-threshold characteristics were also good with an S-value was about 0.8 V/dec, which was about ½ that of Comparative Example 5.

Thus, when the indium oxide thin film according to the present invention was used in a TFT channel layer having a staggered structure, a TFT was realized which had especially excellent characteristics, in which the interface characteristics between the gate insulating film and the channel layer were dramatically improved.

Example 5

A fifth example of a TFT device manufactured by the method according to the present invention will be described using FIG. 2.

First, an indium oxide film was formed on a plastic substrate 10 as the channel layer 11.

In the present example, the indium oxide film was formed by sputtering deposition in an argon-oxygen mixed atmosphere and by an annealing in air.

A target having a composition of $In_2O_3$ (99.9% purity) was used as the target (material source), and the applied RF power was set at 20 W. The distance between the target and the substrate was about 12 cm. An indium oxide film was formed in a $4\times10^{-1}$ Pa argon atmosphere, wherein the introduced oxygen partial pressure was set at $1\times10^{-2}$ Pa. The substrate temperature during film formation was 25° C. and the film deposition rate was 3 nm/min. When the X-ray diffraction of the formed indium oxide film was measured at an incident angle of 0.5° to the film surface, a clear diffraction peak was not found, thereby confirming that the formed indium oxide film was amorphous.

Then, using electron beam heating deposition, an approximately 5 nm-thick titanium layer and an approximately 100 nm-thick gold layer were successively layered from the side near the channel layer, and then a source electrode 12 and a drain electrode 13 were formed by photolithography and a lift-off technique.

Next, the indium oxide film formed by sputtering was subjected to a one-hour annealing in a 200° C. ozone atmosphere exposed to UV radiation. It was found from a four-probe measurement of the obtained indium oxide film that resistivity was about 500 Ωcm. In addition, when the X-ray diffraction of the indium oxide film was measured at an incident angle of 0.5° to the film surface, an $In_2O_3$ diffraction peak was found, thereby confirming that the formed indium oxide film had crystallized. Additionally, X-ray reflectance measurement and spectral ellipsometry were conducted. Analysis of the resultant patterns showed that the root mean square roughness (Rrms) of the thin film was about 0.4 nm, and the film thickness was about 20 nm. It was found from SEM observation that the particle size of the indium oxide film was about 12 nm, and from RBS analysis that the atomic composition ratio (O/In) of the indium and the oxygen was in the range of 1.3 to 1.7.

Next, the silicon oxide film used as the gate insulating film 14 was deposited to a thickness of about 90 nm by electron beam deposition. A titanium layer and a gold layer were then successively layered thereon, and a gate electrode 15 was formed by photolithography and a lift-off technique. The channel length was 10 μm and the channel width was 150 μm.

Comparative Example 6

Except for the channel layer, the structure was the same as in Example 5. The indium oxide film was formed in a $1\times10^{-1}$ Pa oxygen gas atmosphere by resistance heating deposition. An indium pellet was used as the vapor deposition source. The distance from the vapor deposition source to the substrate was about 30 cm. The thickness of the formed indium oxide film was about 20 nm, and the substrate temperature during film formation was 25° C. Further, after the source and drain electrodes had been formed, a one-hour annealing in a 200° C. ozone atmosphere exposed to UV radiation was carried out. The heat treated indium oxide film had a resistivity of 5 kΩcm, an Rrms of about 2.5 nm and a particle size of about 23 nm. Further, it was found from X-ray diffraction that the formed indium oxide film had crystallized.

(TFT Device Characteristics Evaluation)

Compared with Comparative Example 6 the on-current was larger, and when Vg=10 V, a current of about $Id=1\times10^{-4}$ A was flowing. Calculation of the field-effect mobility from the output characteristics gave a value of about 15 $cm^2/Vs$ in the saturated region, which was about 20 times higher than for Comparative Example 6. In addition, the transistor on/off ratio was also $10^6$ or more, which was higher by a magnitude of about 2 compared with Comparative Example 6. The sub-threshold characteristics were also good, with an S-value was about 1.1 V/dec, which was about ½ that of Comparative Example 6.

Thus, when the indium oxide thin film according to the present invention was used in a TFT channel layer having a staggered structure, a TFT was realized which had especially excellent characteristics, in which the interface characteristics between the gate insulating film and the channel layer were dramatically improved.

Example 6

A sixth example of a TFT device manufactured by the method according to the present invention will be described using FIG. 1.

In the present example, a silicon substrate doped with phosphorus was used as the gate electrode 15 and an approximately 100 nm thermal silicon oxide film was used for the gate insulating film 14. An indium oxide film was formed on the thermal silicon oxide film as the channel layer 11.

In the present example, the indium oxide film was formed by sputtering deposition in an argon atmosphere and by an annealing in air.

A target having a composition of $In_2O_3$ (99.9% purity) was used as the target (material source), and the applied RF power was set at 20 W. The distance between the target and the substrate was about 12 cm. An indium oxide film was formed in a $4\times10^{-1}$ Pa argon atmosphere, wherein the introduced oxygen partial pressure was set at 0 Pa. The substrate temperature during film formation was 25° C. and the film deposition rate was 5 nm/min. When the X-ray diffraction of the formed indium oxide film was measured at an incident angle of 0.5° to the film surface, a clear diffraction peak was not found, thereby confirming that the formed indium oxide film was amorphous.

Then, using electron beam heating deposition, an approximately 5 nm-thick titanium layer and an approximately 100 nm-thick gold layer were successively layered from the side near the channel layer, and then a source electrode 12 and a drain electrode 13 were formed by photolithography and a lift-off technique. The channel length was 10 μm and the channel width was 150 μm.

Next, the thus-manufactured TFT was subjected to a one-hour annealing in an air atmosphere of 300° C. It was found from a four-probe measurement of the indium oxide film that the resistivity after the annealing was about 10 Ωcm. Further, when the X-ray diffraction of the indium oxide film was measured at an incident angle of 0.5° to the film surface, an $In_2O_3$ diffraction peak was found, thereby confirming that the formed indium oxide film had crystallized. Additionally, X-ray reflectance measurement and spectral ellipsometry were conducted. Analysis of the resultant patterns showed that the root mean square roughness (Rrms) of the indium thin film was about 0.32 nm, and that the film thickness was about 20 nm. Further, it was found from SEM observation that the particle size of the indium oxide film was about 12 nm, and from RBS analysis that the atomic composition ratio (O/In) of the indium and the oxygen was in the range of 1.3 to 1.7.

(TFT Device Characteristics Evaluation)

Compared with Example 4 the on-current was larger, and the field-effect mobility was a high value of 32 $cm^2$/Vs. In particular, a transistor was realized which had excellent characteristics, in which the subthreshold characteristics were greatly improved with an S-value of about 0.5 V/dec. This is thought to be because in the present example the indium oxide film used as the channel layer was deposited under low-resistance conditions, whereby channel layer formation was realized with little plasma damage.

According to the present invention, a highly-reliable thin film transistor having excellent transistor characteristics such as excellent field-effect mobility and current on/off ratio can be realized. Specifically, a TFT having a current on/off ratio of five orders of magnitude or more and a field-effect mobility of 10 $cm^2$/Vs or more can be manufactured with good reproducibility.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2006-314243, filed Nov. 21, 2006, which is hereby incorporated by reference herein in its entirety.

The invention claimed is:

1. A method for manufacturing a thin film transistor including a channel layer that includes indium oxide, the method comprising:
   forming an indium oxide film for the channel layer; and
   annealing the indium oxide film in an oxidizing atmosphere at a temperature in a range of 150° C. to 450° C.,
   wherein the indium oxide film is amorphous prior to the annealing and is crystalline after the annealing,
   wherein the indium oxide film is formed by sputtering under a gas pressure of 6.5 Pa or less and an oxygen partial pressure of 1 Pa or less during deposition, and
   wherein the crystalline indium oxide film after the annealing step has a surface roughness having a root mean square of 1 nm or less.

2. The method for manufacturing a thin film transistor according to claim 1, wherein the forming of the indium oxide film is carried out in an oxidizing atmosphere having a lower oxygen concentration than the oxidizing atmosphere used in the annealing of the indium oxide film.

3. The method for manufacturing a thin film transistor according to claim 1, wherein, prior to the annealing in the oxidizing atmosphere, the indium oxide film has a resistivity in a range of 1 Ωcm to 100 kΩcm.

4. The method for manufacturing a thin film transistor according to claim 3, wherein, after the annealing in the oxidizing atmosphere, the indium oxide film has a resistivity ranging from more than 1 Ωcm to 100 kΩcm.

* * * * *